(12) United States Patent
Murata

(10) Patent No.: US 7,803,645 B2
(45) Date of Patent: Sep. 28, 2010

(54) SEMICONDUCTOR LIGHT-EMITTING DEVICE AND A METHOD FOR MANUFACTURING THE SAME

(75) Inventor: Michio Murata, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 612 days.

(21) Appl. No.: 11/362,448

(22) Filed: Feb. 27, 2006

(65) Prior Publication Data

US 2006/0205104 A1    Sep. 14, 2006

(30) Foreign Application Priority Data

Mar. 1, 2005   (JP) ............................. 2005-056398

(51) Int. Cl.
*H01L 21/00* (2006.01)

(52) U.S. Cl. ................................. 438/42; 257/E33.067

(58) Field of Classification Search ............ 438/42–44; 257/E33.067, E33.069
See application file for complete search history.

(56) References Cited

U.S. PATENT DOCUMENTS

| | | | | |
|---|---|---|---|---|
| 4,718,070 A | * | 1/1988 | Liau et al. ................. | 372/50.12 |
| 5,661,075 A | * | 8/1997 | Grodzinski et al. ........... | 438/32 |
| 5,729,563 A | * | 3/1998 | Wang et al. ............... | 372/50.23 |
| 2003/0165314 A1 | * | 9/2003 | Nagarajan et al. ........... | 385/131 |

FOREIGN PATENT DOCUMENTS

| | | |
|---|---|---|
| JP | 4-216688 | 8/1992 |
| JP | 5-090694 | 4/1993 |
| JP | 10-242582 | 9/1998 |
| JP | 2001-024276 | 1/2001 |

* cited by examiner

*Primary Examiner*—Davienne Monbleau
*Assistant Examiner*—Matthew Reames
(74) *Attorney, Agent, or Firm*—Smith, Gambrell & Russell, LLP

(57) ABSTRACT

The present invention is to provide a light-emitting device, a laser diode, formed without using the mechanical cleavage, and a process for manufacturing the device. The process comprises, after stacking semiconductor layers of the first cladding layer, the active layer, and the second cladding layer, a forming of a groove to define the laser resonator, the depth of which reaches the substrate, and the mass-transportation, within the groove, from the side surface of the groove in a portion of the substrate and the first cladding layer to the facet of the active layer and the second cladding layer. Since the facet layer thus transported reflects the crystal orientation of the side of the groove, the crystal quality of the facet layer can be maintained.

5 Claims, 4 Drawing Sheets

SEMICONDUCTOR LIGHT-EMITTING DEVICE AND A METHOD FOR MANUFACTURING THE SAME

BACKGROUND OF THE INVENTION

1. Field of the Invention

The present invention relates to a semiconductor light-emitting device and a method for producing the device.

2. Related Prior Art

Japanese Patent published as JP-H10-242582A has disclosed a method for forming a steep edge, nearly normal to a primary surface of a group III-V compound semiconductor. In this method, an etching mask is formed onto the III-V compound semiconductor, and the mask has an edge, where the vertical edge is to be formed, along a direction perpendicular to the crystal orientation [0-1-1]. However, this method exposed the facet of the active layer during the processing, which may degrade the quality thereof, in particular, various centers or dislocations may be induced.

Another Japanese Patent published as JP-H05-090694A has disclosed a semiconductor laser diode. The process for forming this laser diode includes a formation of a waveguide stripe along a <-1-11> orientation on the p-type InP substrate, whose primary surface is (1-10) surface normal to a {111} surface, and an exposure of a mirrored surface with a crystal orientation of {111} in both sides of the waveguide stripe. Thus, the process may manufacture the laser diode, whose mirrored surface perpendicular to the waveguide can be obtained by the etching without the cleaving of the InP substrate, accordingly, the laser diode shows a relatively threshold current and is capable of integrating with other semiconductor devices.

However, this process prevents to use a semiconductor substrate with (100) surface as the primary surface, which causes the degradation of the quality of the semiconductor layers grown thereon. Moreover, the process is unable to cleave the substrate along the (011) surface, which causes not to obtain a laser diode chip with a rectangular shape.

Still another Japanese Patent published as JP-2001-024276A has disclosed a light-emitting device that does not cause a catastrophic optical damage even in an operating condition of high output power and shows a harder tolerance to a kink level appeared in the I-L characteristic of the light-emitting device. The active layer of this device is formed on the optical guiding layer and except for a region close to the edge thereof. The first cladding layer with the second conduction type is formed onto the active layer. The current blocking layer has an opening formed on this first cladding layer. This opening does not reach the edge of the device. The second cladding layer with the second conduction type is formed at least a portion within the opening.

However, the process to form the light-emitting device above accompanies with the cleavage of the substrate, which may cause not only a scattering of the resonator length but the degradation of the resonator facet.

Japanese Patent published as JP-H04-216688A has disclosed a method for manufacturing the laser diode, in which a window layer, the band gap energy which is greater than the active layer, is grown on the stacked semiconductor layers as the exposed surface of this stacked layers is placed on the susceptor of the growing apparatus or the fixture for fixing the laser bar in a face-to-face arrangement. Subsequent to the growth of the window layer, an extraordinary portion grown on an edge between the facet of the resonator and the back surface opposite to the one the window layer is grown thereon. That is, the window layer is grown on the facet of the resonator after forming the laser bar and extraordinarily grown portions are removed after the formation of the window layer.

However, this method request that, after the formation of the laser bar, the window layer is formed onto the facet of the bar and the extraordinarily grown portion is removed. That is, this process requires at least three process steps, the formation of the laser bar by the mechanical cleavage of the substrate, the formation of the window layer onto the facet of the bar, and the removal of the extraordinarily grown portion of the window layer.

SUMMARY OF THE INVENTION

The present invention is to provide a light-emitting device that has a mirrored facet formed without using the mechanical cleavage, and to provide a method for manufacturing such light-emitting device.

One aspect of the present invention relates to a method for manufacturing a semiconductor light-emitting device. The method includes steps of: (a) forming a groove after the formation of a series of layers of the first stacked layer including the semiconductor substrate, the active layer, and the second stacked layer on the semiconductor substrate, the groove having a side surface and a bottom portion, the side surface exposing an end surface of the active layer, the groove reaching the semiconductor substrate, and (b) mass-transporting atoms included within the semiconductor substrate to grow a facet layer on the facet end of the active layer exposed in the side of the groove. The substrate may be made of InP.

In this process, since the groove in the bottom portion thereof reaches the InP substrate, the facet layer grown on the end facet of the active layer becomes a crystal made of InP whose surface orientation reflects the mother crystal, namely, the end facet of the active layer.

The process may further include a step for growing an InP layer onto the InP facet layer to thicken the facet layer. Moreover, the series of layers may be formed on the (100) surface of the InP substrate, and the direction of the groove and the surface orientation of the facet layer may be one of combinations of [011] direction and (011) surface, or [01-1] direction and (01-1) surface, respectively. By selecting these directions, the process may form the facet layer with a mirrored surface without any mechanical cleavage.

Further, the end facet of the active layer is preferable to make an angle from 60° to 80° with respect to the InP substrate with the (100) surface. When the facet layer made of InP is grown on the end facet of the active layer, the surface orientation of the facet layer may be apt to show the (011) or (01-1) surface.

Another aspect of the invention relates to a light-emitting device. The device comprises: (1) A first semiconductor stack with a first conduction type that includes a semiconductor substrate with tow end surfaces; (2) a second semiconductor stack with a second conduction type that is different from the first conduction type; (3) an active layer put between the first and second stacks, this active layer having an optical resonator extending along a preset axis and defined by two end facets; and (4) a facet layer covering end facet of the active layer. In the light-emitting device of the present invention, two end facets of the active layer locate between two end surfaces of the semiconductor substrate.

The substrate and the facet layer of the present invention may be made of InP, and the facet layer is a mirrored surface formed without using the cleavage of the substrate because the face layer is formed between the end surfaces of the substrate.

The first and second semiconductor stacks, and the active layer may be formed on the (100) surface of the InP substrate, the facet layer may have the (011) or (01-1) surface, and the end facet of the active layer may have the crystal surface inclined to the normal of the (011) or (01-1) surface. Forming the facet layer onto such surface, inclined to the normal to the (011) or (01-1) surface, the facet layer may appear a mirrored surface with the (011) or (01-1) orientation.

The active layer of the present invention may be made of group III-V compound semiconductor material containing aluminum. Because the active layer, in particular, the end facet thereof is covered by the InP facet layer not to expose the aluminum contained region. Therefore, the degradation of the reliability due to the oxidization of the aluminum or its concerned mechanism can be prevented.

The light-emitting device of the invention may further comprise a contact layer on the second semiconductor stack. The facet layer may be electrically isolated from the contact layer. The isolation may be carried out by arranging the contact layer apart from the facet layer, or the proton implantation into a portion of the facet layer.

Figure 3A:
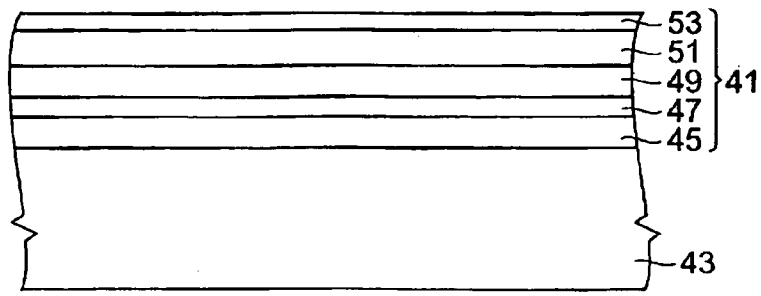
Figure 3B:
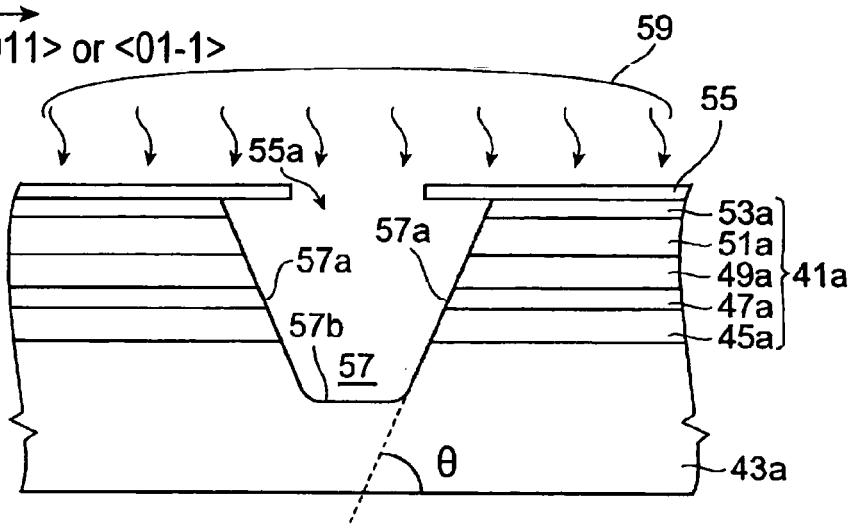
Figure 3C:
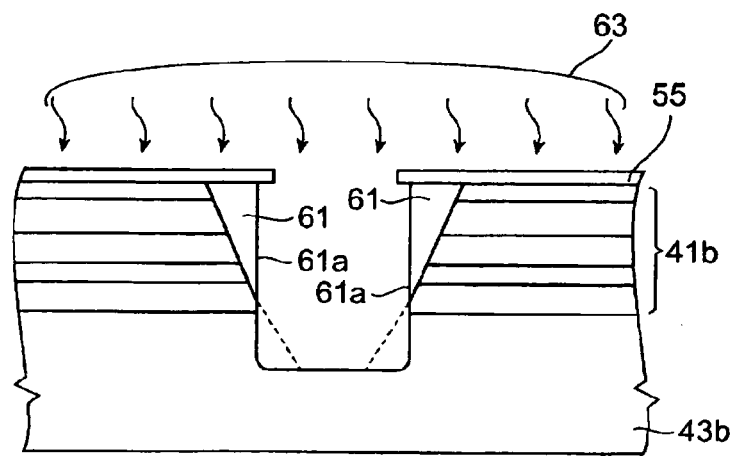
Figure 4A:
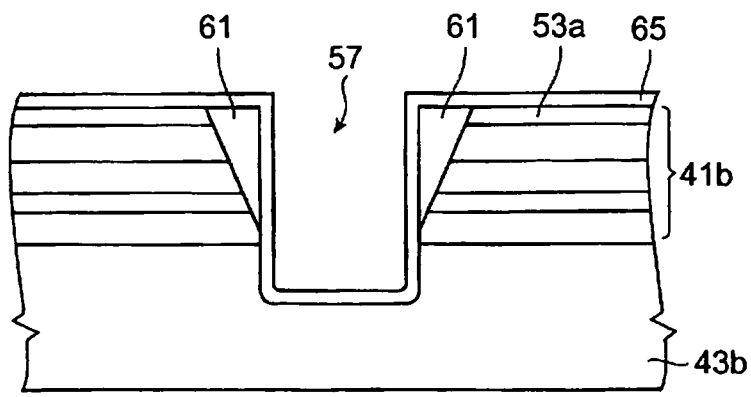
Figure 4B:
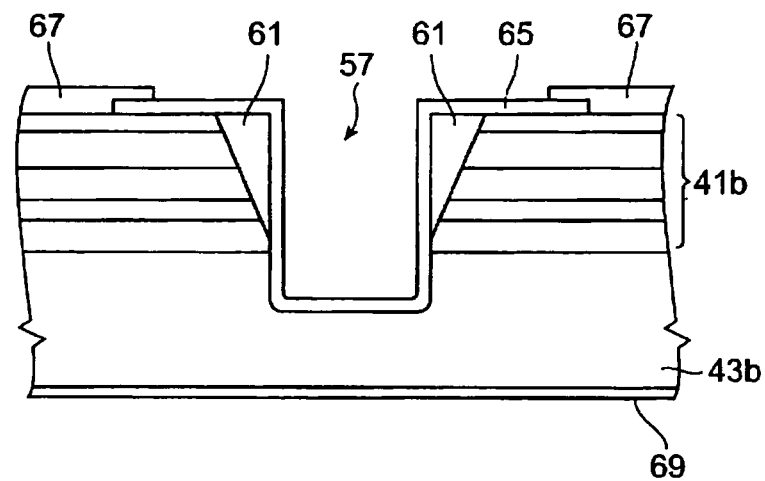
Figure 4C:
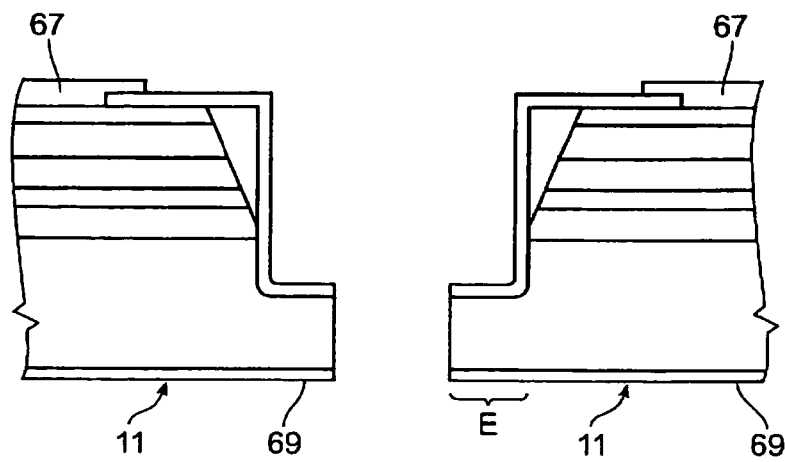

From FIG. 3A to FIG. 3C show steps for manufacturing the semiconductor laser diode in the first half according to the second embodiment of the invention; and From FIG. 4A to FIG. 4C show steps for manufacturing the semiconductor laser diode in the latter half subsequent to the process shown in FIG. 3C.

DESCRIPTION OF PREFERRED EMBODIMENTS

The spirit of the present invention will be easily understood through the following description as referring to accompanying drawings shown as an illustration. Next, as referring to drawings, the light-emitting device and the method for manufacturing the device according to the present invention will be described. In the explanation and drawings herein, the same numerals and symbols will refer to the same elements without overlapping explanations.

FIRST EMBODIMENT

Figure 1:
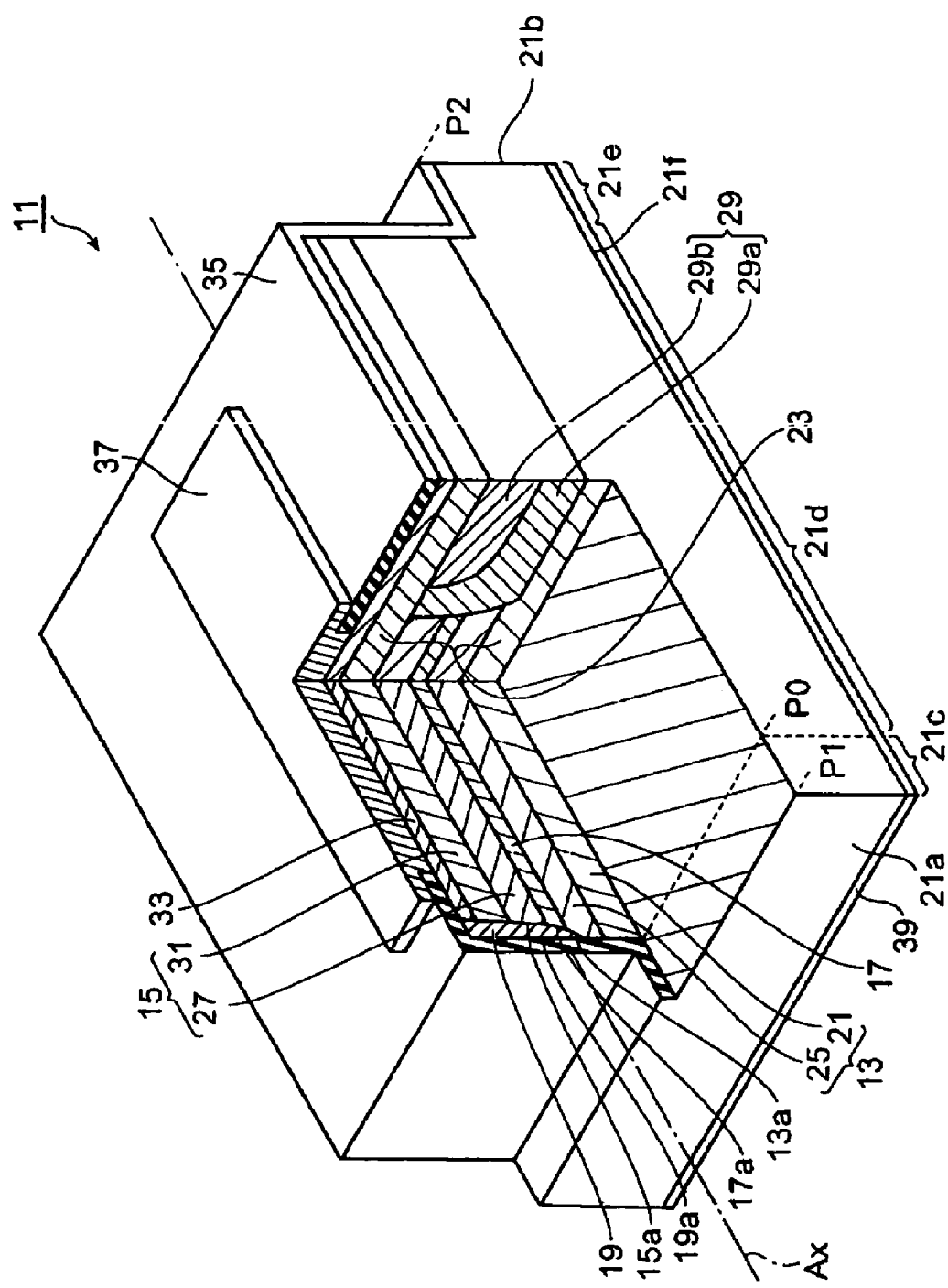
FIG. 1 is a perspective view showing a semiconductor laser diode according to the first embodiment of the invention.

FIG. 1 shows a semiconductor laser diode according to the first embodiment of the present invention as one example of the light-emitting device. The laser diode (hereinafter denoted as LD) 11 includes a first semiconductor stack 13 with a first conduction type, the n-type for example, a second semiconductor stack 15 with a second conduction type, the p-type for example, an active layer 17, and a facet layer 19 made of InP. Two semiconductor stacks, 13 and 15, put the active layer 17 therebetween. The InP substrate 21, a portion of which constitutes the first semiconductor stack, includes first and second end surfaces, 21a and 21b, each intersecting a reference axis Ax. In the present invention, the InP facet layer 19 covers the end facet 17a of the active layer 17, and an end position P0 of the surface 19a of the InP facet layer 19 locates within the end position P1 of the end surface 21a of the InP substrate 21.

The surface 19a of the InP facet layer 19, although a mirrored surface, is not formed by the cleavage in the present invention. The InP facet layer 19 is formed by the mass-transportation, one type of crystal growth techniques, of atoms from another InP layer, such as InP substrate exposed during the process of the LD 11 without using the mechanical cleavage. Therefore, the InP facet layer 19 covers the end facet 17a of the active layer 17, specifically, a portion of the facet 13a of the first semiconductor stack 13 and a portion of or a whole facet 15a of the second semiconductor stack 15.

The LD 11, as shown in FIG. 1, has a buried heterostructure. The active laser 17 is formed between the cladding layers, 25 and 27, with the first and second conduction types, respectively, within the mesa 23. The mesa 23 is buried with the current blocking region 29 formed on the InP substrate 21. The current blocking region 29 includes a first blocking layer 29a on the InP substrate 21 and a second blocking layer 29b on the first blocking layer 29a. On the mesa 23 and the current blocking region 29 are formed with another cladding layer 31 with the second conduction type. The aforementioned second semiconductor stack 15 comprises the second cladding layer and the other cladding layer 31, while the first semiconductor stack 13 includes the first cladding layer 25 in addition to a portion of the InP substrate 21. The InP facet layer 19 may have the band gap energy greater than that of the active layer 17. Since the facet 17a of the active layer 17 is passivated by the facet layer, the band gap energy of which is greater than that corresponding to the wavelength of the light generated in the active layer 17, the so-called catastrophic optical damage (COD) may be suppressed, which causes the degradation of the LD 11 operated in a high power condition.

The InP substrate 21 includes first and second regions, 21c and 21d, each arranging along the reference axis Ax. The mesa 23 is formed in the second region 21d by removing the first region 21c. The InP substrate 21 may further include a third region 21e in an opposite side of the first region 21c with respect to the second region 21d. Thus, the first and third regions, 21c and 21e, put the second region 21d therebetween. The mesa 23 is removed in the third region 21e.

The LD 11 may further include a contact layer 33 with the second conduction type on the second cladding layer 31. The contact layer 33 forms a passivation film 35 thereon with an opening through which a first electrode 37, the anode electrode, comes in contact to the contact layer 33. The passivation film 35 covers the surface 19a of the InP facet layer 19 and the first region 21c, simultaneously the third region 21e when the third region 21e exits. On the other hand, the back surface 21f of the InP substrate 21 forms a second electrode 39, the cathode electrode. These two electrodes, the anode and cathode electrodes, inject carriers into the active layer 21 to recombine them therein to generate light.

One example of the LD 11 is listed in the following table:

TABLE 1

Exemplary structure of the laser diode

| First semiconductor stack 13 | |
|---|---|
| Substrate 21 | n-InP with (100) surface |
| First cladding layer 25 | n-InP |
| Active layer 17 | AlGaInAs MQW layer |
| Second semiconductor stack 15 | |
| Second cladding layer 27 | p-InP |
| Third cladding layer 31 | p-InP |
| InP facet layer 19 | Grown by the mass-transportation |
| Current Blocking region 29 | |

TABLE 1-continued

Exemplary structure of the laser diode

| | |
|---|---|
| First blocking layer 29a | p-InP |
| Second blocking layer 29b | n-InP |
| Contact layer 33 | p-InGaAs |
| Passivation film 35 | $SiO_2$ |

The current blocking region 29, instead of the double layers, 29a and 29b, whose conduction types are opposite to each other, may be buried with a semi-insulating material. The active layer 17 may be configured with the multi-quantum well (MQW) structure or the single quantum well (SQW) structure. Moreover, the overall structure of the LD 11 may constitute the Fabry Perot type (FP) LD and the distributed feedback type (DFB) LD. The reference axis Ax may be along the crystal orientation of <011> or <01-1>.

The LD 11 in the present invention may include a group III-V semiconductor material containing aluminum, such as AlGaInAs, within the active layer 17. Generally, the LD with a material containing aluminum often shows the catastrophic optical damage (COD) under an operating condition with the high optical output power. However, the active layer 17 of the present configuration in the facet thereof is covered by the InP facet layer 19 formed in a continuous process without exposing the semiconductor material containing aluminum to the air, accordingly, the reliability especially in the operation in the high power can be enhanced. Although the table and the description above, the active layer 17 is made of aluminum containing material, the InGaAsP, which is quite popular semiconductor material for the optical communication in a long wavelength range such as 1.3 μm and 1.55 μm, may be used instead of AlGaInAs.

Figure 2A:
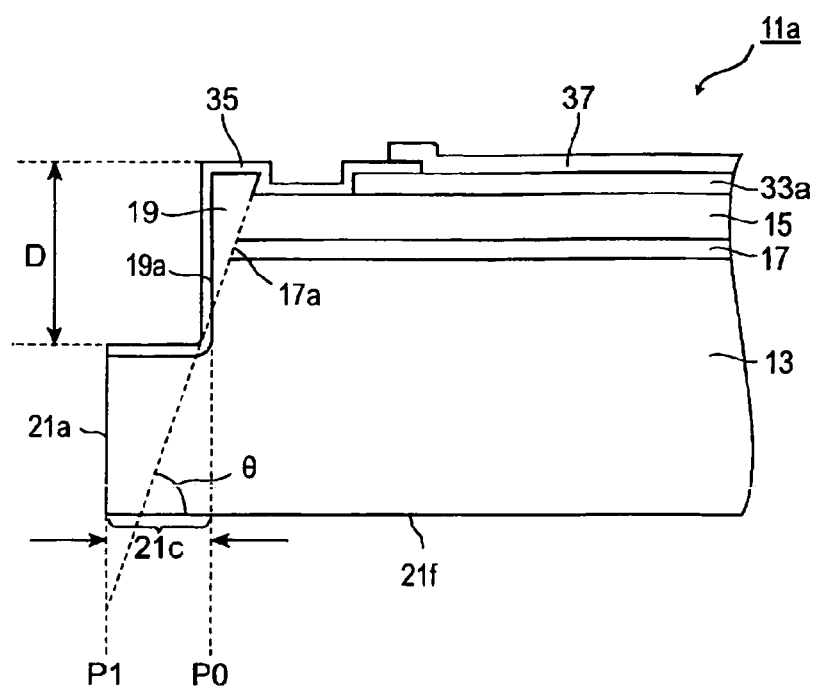
FIG. 2A shows one modification of the laser diode of the first embodiment.

FIG. 2A shows an alternative LD 11a according to the first embodiment. The LD 11a provides a modified contact layer 33a that is physically apart from the InP facet layer 19. This contact layer 33a may be formed by a photolithography. That is, after the growth of the contact layer 33 on the whole surface of the second cladding layer 31, a portion where the InP facet layer is to be mass-transported in the subsequent process is removed by an etching using an etching mask formed by the photolithography. As shown in FIG. 2A, the surface 19a of the InP facet layer 19, the position of which is denoted as P0, is formed inward the end surface 21a of the substrate 21, the position of which is denoted as P1. Preferable distance from the position P0, the surface 19a of the InP facet layer 17, to the other position P1, the end surface of the substrate, exceeds 5 μm and is smaller than 15 μm. Further, the depth D in the first region 21c is preferably from 5 to 10 μm. The embodiment of FIG. 2A sets the depth D to be 8 μm.

The end facet 17a of the active layer 17 is inclined with an angle from 60° to 80° with respect to the back surface 21f of the substrate 21. This inclined surface 17a makes it possible to grow the InP facet layer 19 with a good quality, namely, with less surface states to trap carriers and with nearly mirrored surface.

The LDs, 11 and 11a, the surface 19a of the InP facet layer 19 shows the (011) surface or the (01-1) surface, because the end facet 17a of the active layer 17 has the crystal surface inclined to the (011) or (01-1) surface. When a semiconductor layer is grown on a surface of a semiconductor layer, the grown layer reflects the crystal surface of the semiconductor beneath thereof. However, even when a semiconductor layer is grown on a surface inclined to the (011) or (01-1) surface, a mirrored surface with the (011) or (01-1) orientation can be obtained. In the present invention, the end face 17a of the active layer 17 is inclined by an angle θ to the primary surface of the substrate, which has the (001) crystal orientation, the surface 19a of the InP facet layer may become a mirrored surface with the (011) or (01-1) orientation.

Figure 2B:
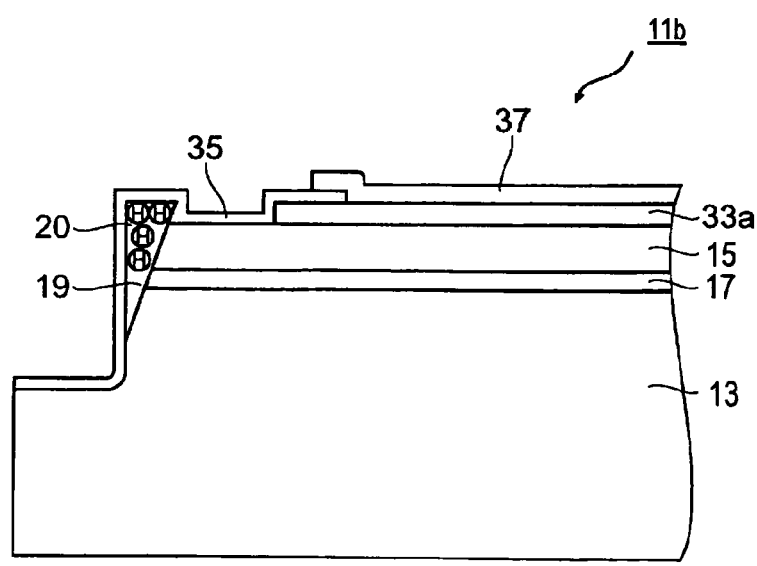
FIG. 2B shows another modification of the laser diode.

FIG. 2B shows still another modification 11b of the first embodiment. The LD 11b in this modification provides the InP facet layer 19, a portion 20 of which is implanted with protons. The portion 20 adjoining the second semiconductor stack 15 is converted into a high resistive region by the proton implantation. The hydrogen concentration in the proton implanted region 20 is preferably from $1 \times 10^{18} \sim 1 \times 10^{20}$ cm$^{-3}$. Since the InP facet layer 19 provides a high resistive region 20, the contact layer 33a in this modification may be replaced to the former contact layer 33 that extends to the InP facet layer 19.

SECOND EMBODIMENT

A method for manufacturing the LD of the present invention will be explained as referring to FIGS. from 3A to 3C and FIGS. from 4A to 4C. These drawings, FIGS. from 3A to 3C and FIGS. from 4A to 4C, show the cross section of the LD 11 interesting the mesa 23, namely, along the crystal orientation of <011> or <01-1>.

FIG. 3A shows a step after an epitaxially grown of semiconductor layers, in which a plurality of semiconductor layers is grown on an n-type InP wafer 43. That is, in FIG. 3A, an n-type InP cladding film 45, an active film 47, a first p-type InP cladding film 49, a second p-type InP cladding film 51, and a p-type contact film 53 are sequentially grown on the InP wafer 43 that has the (100) crystal plane.

Subsequently, as shown in FIG. 3B, a mask 55 is formed on the p-type contact film 53. The mask 55 may be made of inorganic insulating material such as silicon oxide or silicon nitride. The mask 55 provides a plurality of openings 55a with an interval corresponding to a size of the LD chip, which is a length of the optical resonator and typically around 300 μm, and a width thereof from 10 to 30 μm. The opening 55a extends in substantially perpendicular to the mesa stripe. That is, the opening 55a extends along one of the crystal orientations, [011] or [01-1], or their equivalents.

The stacked semiconductor layers 41 are to be etched by using this mask 55 to form a groove 57 therein. The groove 57 favorably reaches the InP wafer 43, or at least the n-type cladding film 45. On the side 57a of this groove 57 is exposed with the facet 47a of the active film 47, and facets of the n-type and p-type cladding films, 45a and 49a. While, in the bottom portion 57b of the groove 57 exposes the n-type InP wafer 43a. The etching to form the groove 57 may be carried out by the so-called wet-etching, or by the dry-etching. A mixed gas of $CH_4$ and $H_2$, or a pure $Cl_2$ is able to apply for the dry-etching. While, for the wet-etching, a mixture of HCl and $H_2NO_3$ may be applicable. This etching, the dry-etching as well as the wet one, may form the groove with a normal tapered side surface 57a, an angle of which may be from 60° to 80° with respect to the primary surface of the n-type InP wafer 43, which has the (001) crystal orientation.

As shown in FIG. 3C, the InP facet layer 61 is formed on the end facet of the active layer 47a by causing the mass transportation of atoms from the n-type InP wafer 43a and the n-type InP cladding film 45a. The surface of the InP facet layer 61 becomes a mirrored surface because the angle of the side surface 57a of the groove 57 is set about the aforementioned value.

The conventional OMVPE (Organic Metal Vapor Phase Epitaxy) technique may cause the mass-transportation. That is, by setting a condition within the growth chamber of the OMVPE equipment to be from 600° C. to 700° C. and an atmosphere containing hydrogen (H₂) and phosphine (PH₃), indium atoms contained in the InP wafer 43a and the n-type cladding films 45a may be transported at the surface of these regions, 43a and 45a, to reshape the end facet of the stacked films 41a to those shown in FIG. 3C. The transportation of atoms proceeds in a situation to minimize the potential energy, that is, the semiconductor layer 61 is formed so as to flatten the roughness of the surface. Since the (011) or (01-1) surface of the crystal with the Zincblende type inherently has the stable atomic structure, therefore, when the mass transportation is brought to a surface slightly inclined to these crystal planes, the grown surface is automatically aligned to the (011) or (01-1) surface. In order to prevent the formation of the (111) surface or any other crystal surfaces except the (011) surface or its equivalent, the original surface prior to the mass-transportation may have an angle from 60° to 80° with respect to the InP wafer with the (001) surface. The surface formed by the mass-transportation has the crystal plane just to the (011) or (01-1) surface. Accordingly, it is smooth enough to apply the mirror constituting the laser resonator.

The InP layer 61 preferably has a size comparable to the mode field diameter of the light generated by the LD. The size of the InP layer 61 on the end facet of the semiconductor region 41a, the side 57a of the groove 57, may be controlled by the condition of the mass-transportation, such as the temperature, the processing time, and the supply ratio of the phosphine (PH₃). One preferable condition is; as supplying the mixed sources of the PH₃ with a concentration of 2%, when the hydrogen [H₂] is used for the carrier gas, the concentration of the PH₃ becomes [PH₃]/([PH₃]+[H₂]), where a parenthesis [00] means the volume of the gasses, under the reaction temperature of 680° C. and the reaction pressure of 100 HPa, the mass-transportation is carried out for 30 minutes. Since the InP layer facet 61 has the band gap energy wider than that of the active layer, the InP facet 61 becomes no barrier to the light emitted from the active layer.

It may be applicable that, subsequent to the mass-transportation of indium atoms, another InP film is grown on the InP facet layer 61 by supplying the tri-methyl-indium in addition to the PH₃ to make the InP layer 61 thick. In this subsequent growth, the grown layer of InP shows the mirrored surface with the minimized surface energy by automatically aligning with the crystal plane thereof.

The etching mask 55 is removed after the growth of the InP layer 61. Next, as shown in FIG. 4A, the passivation film 65 is formed on the whole surface of the semiconductor films. The passivation film 65 covers, not only the top surface of the contact film 53a, but also the bottom 57b of the groove 57, which exposes the InP wafer, and the side 57a thereof including the InP facet layer 61. A thickness of the passivation film 65 may be adjusted in accordance with the configuration of the LD, namely, the type of the LD. For example, when the LD is the DFB laser, the thickness of the passivation film 65 is set to a value to reduce the reflectivity thereof, while the LD is the type of the FP, the thickness thereof is set to be a value to enhance the reflectivity.

Subsequent to the formation of an opening in the passivation film 65, the anode electrode 67 is formed thereon, while the cathode electrode 69 is formed in the back surface of the InP wafer 43b. Then, as shown in FIG. 4C, the InP 43b wafer is cut along the groove 57 by, for example, the cleavage of the wafer 43a to get LD bars or LD chips. According to the present method, the mirror facet to form the laser resonator can be obtained without the cleavage. The position of the cutting, the cleavage, may be determined such that the light emitted from the active layer is not interrupted by the edge portion E of the InP substrate.

The conduction type of the layer formed by the mass-transportation is bound to the original layer, namely, the conduction type of the InP facet layer becomes the same with the n-type InP substrate in the present embodiment. Therefore, to inject carrier into the active layer in effective, the contact layer not only the anode electrode formed thereon is preferably isolated from the InP mass-transported layer. Or, by the proton implantation, the mass-transported InP layer is preferably isolated from the contact layer.

While preferred embodiments of the present invention are thus described as referring to drawings, it is understood that those skilled in the art, both now and in the future, may make various improvements and enhancements that fall within the scope of the flowing claims. These claims should be construed to maintain the proper protection for the invention first disclosed.

What is claimed is:

1. A method for manufacturing a light-emitting device that includes a stacked layer comprising a first cladding layer, an active layer, and a second cladding layer, each provided on a semiconductor substrate, the method including the steps of:
    (a) after the formation of the stacked layer, forming a groove in the stacked layer by using an etching mask made of inorganic material, wherein the groove reaches the semiconductor substrate and has a bottom portion and a side surface extending along one of [001] and [0-1] crystal orientations of the semiconductor substrate, wherein the side surface of the groove is a smooth incline by 60 to 80 degrees with respect to the surface of the substrate, and is formed by an exposed side surface of each of the first cladding layer, the active layer, and the second cladding layer, and wherein the groove exposes an end facet of the active layer, and
    (b) forming, by using a mass-transportation, a facet layer on the side surface of the groove without removing the etching mask, wherein
    the facet layer forms a mirror extending along one of (01-1) or (011) crystal surfaces corresponding to the direction of the groove, the mirror forming an optical resonator of the light-emitting device extending along the preset axis, and
    the semiconductor substrate and the facet layer are made of InP.

2. The method according to claim 1, further including a step of forming a passivation film on the facet layer after forming the facet layer.

3. The method according to claim 1, wherein the active layer is formed on a (100) surface of the InP substrate.

4. The method according to claim 1, further including a step of forming a contact layer on the second cladding layer such that the contact layer is physically separated from the facet layer.

5. The method according to claim 1, further including a step of cutting the substrate at the bottom portion of the groove after the formation of the facet layer.

* * * * *